(12) United States Patent
Oh et al.

(10) Patent No.: US 11,227,883 B2
(45) Date of Patent: Jan. 18, 2022

(54) IMAGE SENSING DEVICE HAVING A SHARED PIXEL STRUCTURE INCLUDING MOS TRANSISTORS

(71) Applicant: SK hynix Inc., Icheon-si (KR)

(72) Inventors: Se Kyung Oh, Yongin-si (KR); Pyong Su Kwag, Eumseong-gun (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/867,353

(22) Filed: May 5, 2020

(65) Prior Publication Data

US 2021/0127082 A1 Apr. 29, 2021

(30) Foreign Application Priority Data

Oct. 29, 2019 (KR) .......................... 10-2019-0135470

(51) Int. Cl.
| | |
|---|---|
| *H01L 27/146* | (2006.01) |
| *H04N 5/374* | (2011.01) |
| *H04N 5/355* | (2011.01) |
| *H04N 5/3745* | (2011.01) |

(52) U.S. Cl.
CPC .. *H01L 27/14603* (2013.01); *H01L 27/14601* (2013.01); *H04N 5/3559* (2013.01); *H04N 5/3742* (2013.01); *H04N 5/37457* (2013.01); *H01L 27/1463* (2013.01)

(58) Field of Classification Search
None
See application file for complete search history.

(56) References Cited

U.S. PATENT DOCUMENTS

| | | | |
|---|---|---|---|
| 8,773,562 B1* | 7/2014 | Fan | H01L 27/14643 348/308 |
| 10,573,682 B2* | 2/2020 | Oh | H04N 5/3745 |
| 2016/0044264 A1* | 2/2016 | Sakano | H04N 5/3742 348/308 |
| 2017/0214878 A1 | 7/2017 | Van Der Tempel | |
| 2017/0236858 A1* | 8/2017 | Oh | H04N 5/2257 257/292 |
| 2018/0102392 A1* | 4/2018 | Hwang | H04N 5/378 |
| 2018/0220093 A1* | 8/2018 | Murao | H01L 27/14607 |
| 2019/0221600 A1* | 7/2019 | Oh | H04N 5/3745 |
| 2020/0057149 A1* | 2/2020 | Kugimiya | G01S 7/499 |
| 2020/0119064 A1* | 4/2020 | Yun | H04N 5/369 |
| 2021/0005647 A1* | 1/2021 | Kwag | H01L 27/14643 |
| 2021/0020681 A1* | 1/2021 | Kwag | H01L 27/14641 |
| 2021/0025993 A1* | 1/2021 | Choi | G01S 17/89 |
| 2021/0044771 A1* | 2/2021 | Kwag | G01J 1/44 |

FOREIGN PATENT DOCUMENTS

KR 10-2018-0079219 A 7/2018

* cited by examiner

*Primary Examiner* — Twyler L Haskins
*Assistant Examiner* — Wesley J Chiu
(74) *Attorney, Agent, or Firm* — Perkins Coie LLP

(57) ABSTRACT

An image sensing device is disclosed. The image sensing device includes a plurality of unit pixels arranged as an array of unit pixels in a first direction and a second direction perpendicular to the first direction, and a device isolation structure wherein each of the unit pixels is disposed in a region isolated from adjacent unit pixels and includes a single photoelectric conversion element, a single floating diffusion region, and at least three transistors. The single photoelectric conversion element, the single floating diffusion region, and the at least three transistors are located in a region isolated by the device isolation structure.

18 Claims, 6 Drawing Sheets

IMAGE SENSING DEVICE HAVING A SHARED PIXEL STRUCTURE INCLUDING MOS TRANSISTORS

CROSS-REFERENCE TO RELATED APPLICATION

This patent document claims the priority and benefits of Korean patent application No. 10-2019-0135470, filed on Oct. 29, 2019, which is incorporated by reference in its entirety as part of the disclosure of this patent document.

TECHNICAL FIELD

The technology and implementations disclosed in this patent document generally relate to an image sensing device.

BACKGROUND

An image sensing device is a semiconductor device for converting an optical image into electrical signals. Image sensing devices may be classified into CCD (Charge Coupled Device) image sensing devices and CMOS (Complementary Metal Oxide Semiconductor) image sensing devices.

With the recent development of CMOS image sensors, demand for high-quality and high-performance CMOS image sensors has been rapidly increasing in various electronic appliances, for example, smartphones, digital cameras, etc. CMOS image sensors include a photoelectric conversion element to generate charges from incident light received from outside, and one or more circuits to process electrical signals corresponding to the generated charges.

As resolution of the CMOS image sensors increases, the size of each pixel contained in the CMOS image sensors is gradually reduced to increase the number of pixels without increasing a chip size. Therefore, interference between pixels, for example, crosstalk, may occur, which results in reducing the quality and accuracy of an image.

SUMMARY

The disclosed technology relates to an image sensing device for adjusting a conversion gain while simultaneously minimizing a characteristic deviation between a plurality of pixels.

In accordance with an embodiment of the disclosed technology, an image sensing device may include a plurality of unit pixels arranged as an array of unit pixels in a first direction and a second direction perpendicular to the first direction, and a device isolation structure wherein each of the unit pixels is disposed in a region isolated from adjacent unit pixels and includes a single photoelectric conversion element, a single floating diffusion region, and at least three transistors. The single photoelectric conversion element, the single floating diffusion region, and the at least three transistors may be located in the region isolated by the device isolation structure.

In accordance with another embodiment of the disclosed technology, an image sensing device may include a pixel group including first to sixth unit pixels such that the first unit pixel and the second unit pixel are arranged adjacent to each other in a first row, the third unit pixel and the fourth unit pixel are arranged adjacent to each other in a second row, and the fifth unit pixel and the sixth unit pixel are arranged adjacent to each other in a third row. Each of the first to sixth unit pixels may include a photoelectric conversion element and a floating diffusion region. Floating diffusion regions of the first to fourth unit pixels are electrically interconnected to one another to form a common floating diffusion node. Some unit pixels among the third to sixth unit pixels include first transistors, each first transistor configured as a MOS capacitor having source region and a drain region that are electrically coupled to each other. Any one of the some unit pixels may include a second transistor configured to selectively connect the MOS capacitor to the common floating diffusion node.

In accordance with another embodiment of the disclosed technology, an image sensing device may include a first to fourth unit pixels arranged adjacent to each other in a first direction and a second direction perpendicular to the first direction, each of which includes a photoelectric conversion element and a floating diffusion region. The floating diffusion regions of the first to fourth unit pixels may be electrically and commonly interconnected to form a common floating diffusion node. Unit pixels among the first to fourth unit pixels may include first transistors, each configured as a MOS capacitor having a source region and a drain region that are electrically coupled to each other.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

This patent document provides implementations and examples of image sensing devices that substantially address one or more issues due to limitations and disadvantages of the related art. Some implementations of the disclosed technology suggest designs of an image sensing device for adjusting a conversion gain while simultaneously minimizing characteristic deviation between pixels. In recognition of the issues above, the disclosed technology provides various implementations of an image sensing device which can adjust a conversion gain while simultaneously minimizing characteristic deviation between pixels, resulting in improvements of operational characteristics of the image sensing device.

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

Figure 1:
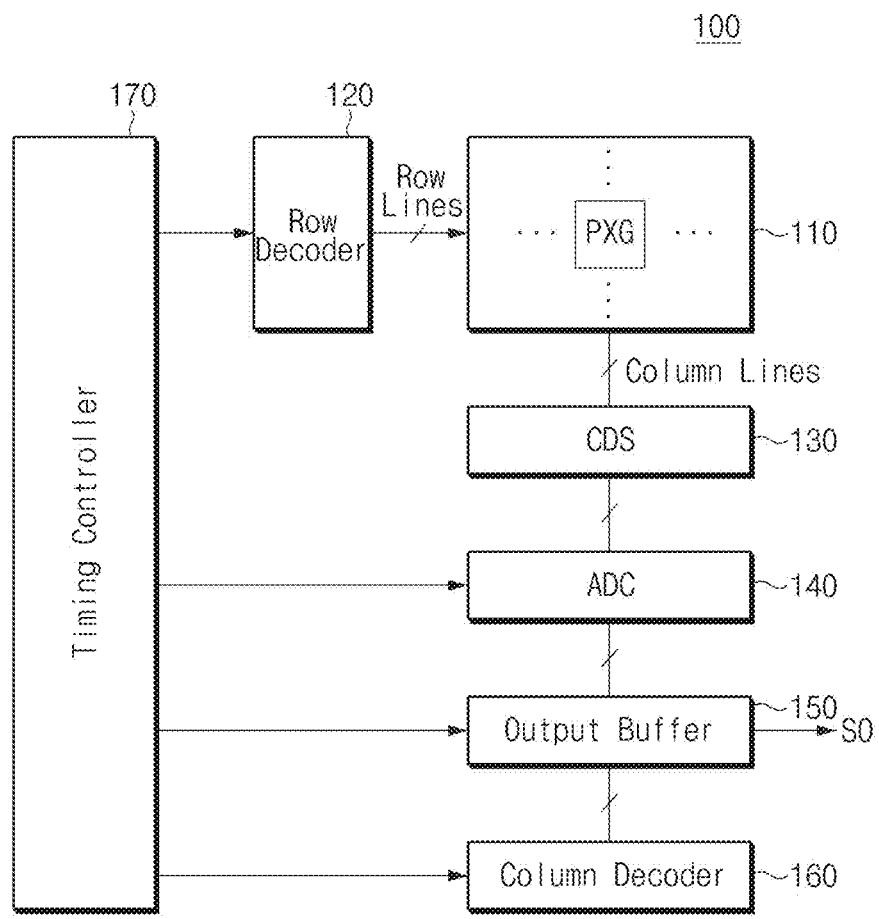
FIG. 1 is an example of a block diagram illustrating an image sensing device based on some implementations of the disclosed technology.

FIG. 1 is a block diagram illustrating an image sensing device 100 based on some implementations of the disclosed technology.

Referring to FIG. 1, the image sensing device 100 may include a pixel array 110, a row decoder 120, a correlated double sampler (CDS) circuit 130, an analog-to-digital converter (ADC) circuit 140, an output buffer 150, a column decoder 160, and a timing controller 170. In this case, the above-mentioned constituent elements of the image sensing device 100 are disclosed only for illustrative purposes, and at least some elements may be added to or omitted from the image sensing device 100 as necessary.

The pixel array 110 may be formed in a substrate, and may include a plurality of pixel groups (PXGs) arranged in a matrix shape. Each pixel group (PXG) may include a plurality of unit pixels to convert an optical signal received from outside into an electrical signal. Each unit pixel may include a photosensing pixel to convert an optical signal into an electrical signal. The photosensing element may include, for example, a photodiode, a photogate, a phototransistor, a photoconductor, or some other photosensing structures capable of generating photocharges. The pixel array 110 may receive a drive signal from the row decoder 120. The drive signal may include a drive signal including, for example, a row selection signal, a reset signal, a transmission (Tx) signal, and the like. The pixel array 110 may be driven by the drive signal.

The row decoder 120 may drive the pixel array 110 upon receiving a control signal from the timing controller 170. In particular, the row decoder 120 may select at least one row line from among a plurality of row lines of the pixel array 110. In order to select at least one row line from among the plurality of row lines, the row decoder 120 may generate a row selection signal. The row selection signal may be transmitted through row lines. The row decoder 120 may sequentially enable the reset signal and the transmission (Tx) signal for pixels corresponding to the at least one selected row line. Therefore, an analog reference signal and an analog image signal may be generated by each of the pixels contained in the selected row line, such that the analog reference signals and the analog image signals generated by the respective pixels contained in the selected row line can be sequentially transferred to the correlated double sampler (CDS) circuit 130. In this case, the reference signal and the image signal generated by each pixel may be generically called a pixel signal as necessary.

In some implementations, the image sensing device may use the correlated double sampler (CDS) to remove an offset value of pixels by sampling a pixel signal twice so that the difference is taken between these two samples. For example, the correlated double sampler (CDS) may remove an offset value of pixels by comparing pixel output voltages obtained before and after light is incident on the pixels, so that only pixel signals based on the incident light can be actually measured. The correlated double sampler (CDS) circuit 130 may sequentially sample and hold the reference signal and the image signal that are transferred from the pixel array 110 through the plurality of column lines. Thus, the correlated double sampler (CDS) circuit 130 may sample and hold levels of the reference signal and the image signal that correspond to each column of the pixel array 110.

The correlated double sampler (CDS) circuit 130 may transmit a correlated double sampling (CDS) signal corresponding to the reference signal and the image signal for each column to the ADC circuit 140 upon receiving a control signal from the timing controller 170.

The ADC circuit 140 may receive the CDS signal for each column from the CDS circuit 130, may convert the received CDS signal into a digital signal, and may thus output the digital signal. The ADC circuit 140 may perform counting and calculation operations based on the CDS signal for each column and a ramp signal received from the timing controller 170, such that the ADC circuit 140 may generate digital image data from which noise (for example, unique reset noise for each pixel) corresponding to each column is removed.

The ADC circuit 140 may include a plurality of column counters corresponding to respective columns of the pixel array 110, and may convert the CDS signal for each column into a digital signal using the column counters. In accordance with another embodiment, the ADC circuit 140 may include a single global counter, and may convert a CDS signal corresponding to each column into a digital signal using a global code received from the global counter.

The output buffer 150 may receive image data for each column received from the ADC circuit 140, may capture the received image data, and may output the captured image data. The output buffer 150 may temporarily store image data that is output from the ADC circuit 140 upon receiving a control signal from the timing controller 170. The output buffer 150 may operate as an interface configured to compensate for a difference in transmission (Tx) speed (or in processing speed) between the image sensor 100 and another device coupled to the image sensor 100.

The column decoder 160 may select a column of the output buffer 150 upon receiving a control signal from the timing controller 170, and the image data temporarily stored in the selected column of the output buffer 150 may be sequentially output. In more detail, the column decoder 160 may receive an address signal from the timing controller 170, may generate a column selection signal based on the received address signal, and may select a column of the output buffer 160, such that the column decoder 160 may control image data to be output as an output signal SO from the selected column of the output buffer 160.

The timing controller 170 may control the row decoder 120, the ADC circuit 140, the output buffer 150, and the column decoder 160.

The timing controller 170 may transmit a clock signal needed for the constituent elements of the image sensor 100, a control signal needed for timing control, and address signals needed for selection of a row or column to the row decoder 120, the column decoder 160, the ADC circuit 140, and the output buffer 150. In accordance with the embodiment, the timing controller 170 may include a logic control circuit, a phase locked loop (PLL) circuit, a timing control circuit, a communication interface circuit, etc.

Figure 2:
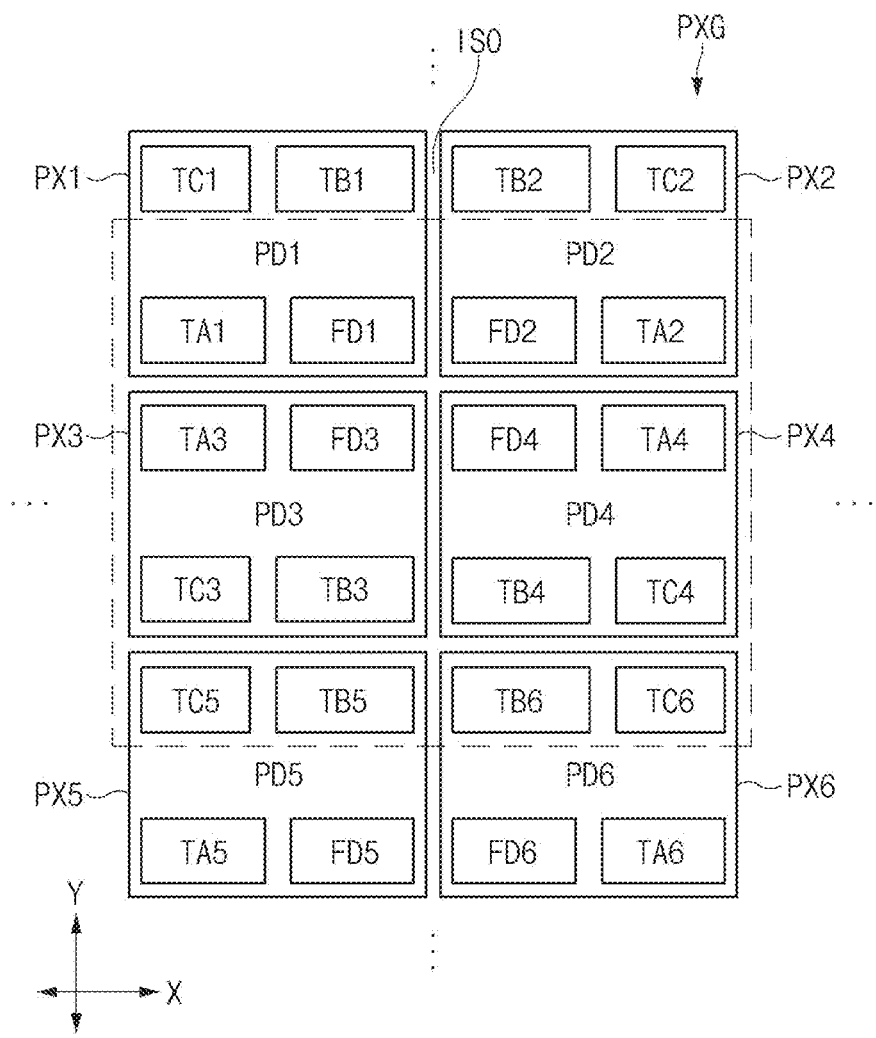
FIG. 2 is an example of a schematic diagram illustrating a pixel array shown in FIG. 1 based on some implementations of the disclosed technology.

FIG. 2 is an example of a schematic diagram illustrating a portion of a pixel array shown in FIG. 1 based on some implementations of the disclosed technology.

The pixel array 110 may include a plurality of pixel groups (PXGs) consecutively and repeatedly arranged in a first direction (X-axis direction) and a second direction (Y-axis direction) perpendicular to the first direction.

As shown in FIG. 2, each pixel group (PXG) may include 6 unit pixels PX1 to PX6.

Each of the unit pixels PX1 to PX6 may be physically isolated from other unit pixels by a device isolation structure (ISO). Therefore, each of the unit pixels PX1 to PX6 is designed not to physically share a photoelectric conversion element PD, a floating diffusion (FD) region, or a transistor with another unit pixel. Thus, a single photoelectric conversion element PD, a single floating diffusion (FD) region, or a single transistor can be disposed within a unit pixel region surrounded by the device isolation structure (ISO) and cannot be disposed over two or more unit pixel regions. For example, each of the unit pixels PX1 to PX6 includes its own photoelectric conversion element PD, floating diffusion (FD) region, or transistor.

In some implementations, the device isolation structure (ISO) may include a trench-shaped isolation structure in which a substrate is etched to a predetermined depth and an insulation material is buried or disposed in the etched region. For example, the device isolation structure (ISO) may include a Deep Trench Isolation (DTI) structure, a Shallow Trench Isolation (STI) structure, or a combination thereof.

Each of the unit pixels PX1 to PX6 may include a Back Side Illumination (BSI) structure or a Front Side Illumination (FSI) structure.

In some implementations, electrical connection between elements contained in different unit pixels may be achieved through a metal line.

Each of the unit pixels PX1 to PX6 may include a single photoelectric conversion element (any one of PD1 to PD6), a single floating diffusion (FD) region (any one of FD1 to FD6), and three transistors (any one of TA1 to TA6, any one of TB1 to TB6, and any one of TC1 to TC6). For example, the unit pixel PX1 may include a single photoelectric conversion element (PD1), a single floating diffusion region (FD1), and three transistors TA1, TB1, and TC1.

Layout structures of plural elements FD, TA, TB and TC in the respective unit pixels PX1 to PX6 may be applied identically for each pixel group (PXG). For example, in each of the unit pixels PX1 to PX6, the floating diffusion (FD) region may be arranged around one corner of each unit pixel, a transistor (TA) may be arranged adjacent to the floating diffusion (FD) region along the X-axis direction, a transistor (TB) may be arranged adjacent to the floating diffusion (FD) region along the Y-axis direction, and a transistor (TC) may be arranged adjacent to the transistor (TB) along the X-axis direction. Thus, the transistor (TC) may be arranged adjacent to the transistor (TA) along the Y-axis direction and disposed diagonally to and the floating diffusion (FD) region.

In some implementations, in the pixel group (PXG), the elements FD, TA, TB and TC of contiguous or adjacent unit pixels may be arranged symmetrically with respect to a boundary between two contiguous or adjacent unit pixels. In some implementations, the elements FD, TA, TB and TC of a unit pixel have identical sizes as those of another unit pixel, respectively, when another unit pixel is contiguous or adjacent to the unit pixel and the elements FD, TA, TB and TC are symmetrically arranged with a boundary between the unit pixel and another unit pixel. For example, in the unit pixels PX1 and PX2 that are contiguous or adjacent to each other in the X-axis direction, the floating diffusion region FD1 of the unit pixel PX1 may be identical in size to the floating diffusion region FD2 of the unit pixel PX2, and the transistors TA1, TB1, and TC1 of the unit pixel PX1 may be identical in size to the transistors TA2, TB2, and TC2 of the unit pixel PX2. The floating diffusion region FD1 and the transistors TA1, TB1, and TC1 of the unit pixel PX1 may be arranged symmetrical to the floating diffusion region FD2 and the transistors TA2, TB2, and TC2 of the unit pixel PX2 with respect to a boundary between the unit pixels PX1 and PX2. In addition, in the unit pixels PX1 and PX3 that are contiguous or adjacent to each other in the Y-axis direction, the floating diffusion region FD1 of the unit pixel PX1 may be identical in size to the floating diffusion region FD3 of the unit pixel PX3, and the transistors TA1, TB1, and TC1 of the unit pixel PX1 may be identical in size to the transistors TA3, TB3, and TC3 of the unit pixel PX3. The floating diffusion region FD1 and the transistors TA1, TB1, and TC1 of the unit pixel PX1 may be arranged symmetrical to the floating diffusion region FD3 and the transistors TA3, TB3, and TC3 of the unit pixel PX3 with respect to a boundary between the unit pixels PX1 and PX3. In the remaining unit pixels, a plurality of elements of two contiguous or adjacent unit pixels in the X-axis direction or the Y-axis direction may also be arranged symmetrical to each other in the same manner as described above.

As the unit pixels are structured to have the floating diffusion regions and the transistors that have a same size in the respective unit pixels and are arranged symmetrically between two contiguous or adjacent unit pixels, it is possible to minimize pixel unit deviation and ensure quality imaging performance.

In four contiguous or adjacent unit pixels PX1 to PX4 among the unit pixels PX1 to PX6, the floating diffusion regions FD1 to FD4 may be located as close as possible to one another. For example, the floating diffusion regions FD1 to FD4 of the contiguous or adjacent unit pixels PX1 to PX4 may be located around a corner region where four corners of four unit pixels PX1 to PX4 meet. Thus, the floating diffusion regions FD1 to FD4 may meet each other in the corner region. The floating diffusion regions FD1 to FD4 may be electrically coupled to each other through a metal line, resulting in formation of a single common node.

The image sensing device according to the present embodiment may include a 4-shared pixel structure in the pixel group (PXG) in which 6 unit pixels PX1 to PX6 are arranged in the form of a (3×2) structure including three rows and two columns. In the 4-shared pixel structure, four floating diffusion regions FD1 to FD4 may be commonly coupled to each other so as to form a single node, and four photoelectric conversion elements PD1 to PD4 respectively corresponding to the floating diffusion regions FD1 to FD4 may share the single node commonly coupled to the floating diffusion regions FD1 to FD4. By the above-mentioned layout structure, the metal line through which the floating diffusion regions FD1 to FD4 are interconnected can be minimized in length. For convenience of description, the above-mentioned four floating diffusion (FD) regions FD1 to FD4 that are electrically and commonly coupled to each other will hereinafter be referred to as a common floating diffusion (CFD) node.

In other four unit pixels PX3 to PX6 among the unit pixels PX1 to PX6, the transistors TB3 to TB6 may be arranged as close as possible to one another. Each of the transistors TB3 to TB6 may be used as any one of a reset transistor for resetting a common floating diffusion (CFD) node in response to a reset signal, a source follower transistor for outputting a signal corresponding to a voltage magnitude of the common floating diffusion (CFD) node, or a gain switching element for adjusting capacitance of the common floating diffusion (CFD) node in response to a gain control signal. For example, the transistor TB3 may be used as a reset transistor, and the transistors TB4 and TB6 may be used as source follower transistors. The transistor TB5 may be used as a gain switching element.

In the pixel group (PXG), the transistors TA1 to TA4 may be used as transfer transistors which transmit photocharges generated from the corresponding photoelectric conversion elements PD1 to PD4 to the corresponding floating diffusion regions FD1 to FD4 in response to a transmission (Tx) signal. The respective transistors TC3 to TC6 may be used as selection transistors that transmit output signals of the source follower transistors TB4 and TB6 to a column line in response to a row selection signal, or may also be used as MOS capacitor(s) which are selectively coupled (e.g., serial connection or parallel connection) to the common floating diffusion (CFD) node in response to ON/OFF operations of the gain switching element. For example, a source region and a drain region of the transistor TC3 and the transistor TC5 may be electrically coupled to each other through metal lines, such that the resultant connection structure may be used as a MOS transistor. The transistors TC4 and TC6 may be used as the selection transistors.

As denoted by dotted lines of FIG. 2, the photoelectric conversion elements PD1 to PD4, the floating diffusion regions FD1 to FD4, and the transistors TA1 to TA4, TB3 to TB6, and TC3 to TC6 may implement the 4-shared pixel structure.

Each of the photoelectric conversion elements PD1 to PD6 respectively contained in the unit pixels PX1 to PX6 may be formed in a lower region (or a lower portion) of the substrate of the corresponding unit pixel. In some implementations, in order to increase light reception efficiency, the photoelectric conversion elements PD1 to PD6 may be formed to occupy the entire lower region of the substrate in the corresponding unit pixels PX1 to PX6.

Although FIG. 2 illustrates an exemplary case in which the pixel group (PXG) includes the unit pixels PX1 to PX6 arranged in the (3×2) structure for convenience of description, other implementations are also possible. For example, it is obvious to those skilled in the art that the same arrangement method can also be applied to 6 unit pixels formed in a (2×3) structure.

The unit pixels PX1 and PX2 may form another 4-shared pixels with unit pixels that are arranged above the unit pixels PX1 and PX2. The transistor TC1 and the transistor TB1 of the unit pixel PX1 may be used as a MOS capacitor and a gain switching element in another 4-shared pixels. In the unit pixel PX2, the transistor TB2 and the transistor TC2 may be used as a source follower transistor and a selection transistor in another 4-shared pixels.

The unit pixels PX5 and PX6 may form another 4-shared pixels with unit pixels that are arranged below the unit pixels PX5 and PX6. The transistors TA5 and TA6 of the unit pixels PX5 and PX6 may be used as transfer transistor in another 4-shared pixels.

Figure 3:
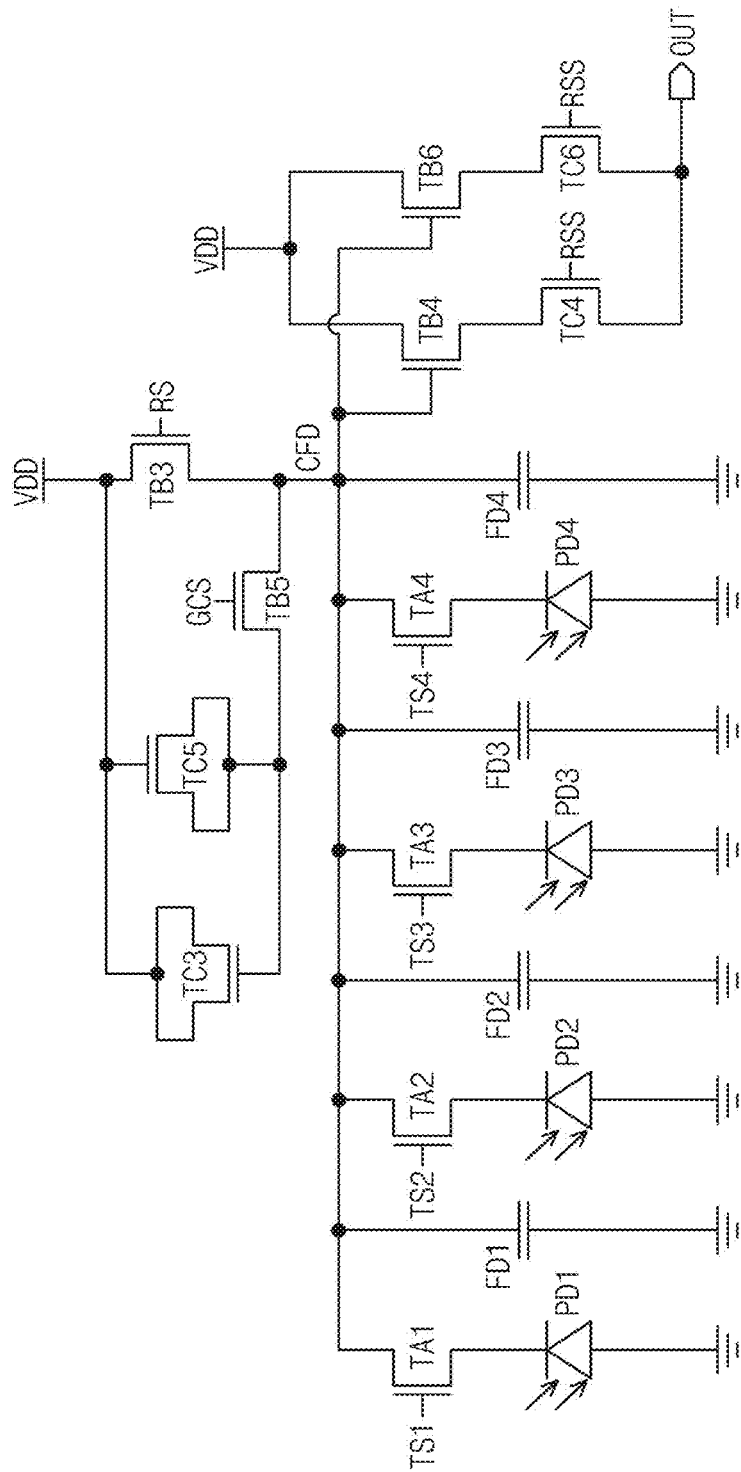
FIG. 3 is an example of an equivalent circuit diagram illustrating shared pixels shown in FIG. 2 based on some implementations of the disclosed technology.

FIG. 3 is an example of an equivalent circuit diagram illustrating shared pixels shown in FIG. 2 based on some implementations of the disclosed technology.

Referring to FIG. 3, the 4-shared pixels according to the present embodiment may include photoelectric conversion elements PD1 to PD4, floating diffusion regions FD1 to FD4, and transistors TA1 to TA4, TB3 to TB6, and TC3 to TC6.

Each of the photoelectric conversion elements PD1 to PD4 may perform photoelectric conversion of incident light, and thus generate photocharges corresponding to the amount of incident light. Each of the photoelectric conversion elements PD1 to PD4 may be implemented as a photodiode, a phototransistor, a photogate, a pinned photodiode, or a combination thereof.

The transistors TA1 to TA4 may be located between the photoelectric conversion elements PD1 to PD4 and the floating diffusion regions FD1 to FD4. In some implementations, the transistor TA1 may be located between the photoelectric conversion element PD1 and the floating diffusion region FD1, the transistor TA2 may be located between the photoelectric conversion element PD2 and the floating diffusion region FD2, the transistor TA3 may be located between the photoelectric conversion element PD3 and the floating diffusion region FD3, and the transistor TA4 may be located between the photoelectric conversion element PD4 and the floating diffusion region FD4. Thus, one side of each transistor TA1 to TA4 may be coupled to the photoelectric conversion element PD1 to PD4 in the same unit pixel, and the other side of each transistor TA1 to TA4 may be coupled to the floating diffusion region FD1 to FD4 in the same unit pixel. The transistors TA1 to TA4 may be turned on or off in response to transmission signals TS1 to TS4 applied to gate electrodes thereof, such that the transistors TA1 to TA4 may transmit photocharges generated from the photoelectric conversion elements PD1 to PD4 to the corresponding floating diffusion regions FD1 to FD4. Each of the transistors TA1 to TA4 may operate as a transfer transistor. For convenience of description, the transistors TA1 to TA4 will hereinafter be referred to as transfer transistors.

The floating diffusion regions FD1 to FD4 may be electrically and commonly coupled to each other through conductive lines, resulting in formation of a common floating diffusion (CFD) node. The common floating diffusion (CFD) node may be modeled as a single junction capacitor which the floating diffusion regions FD1 to FD4 are coupled in parallel to each other. Capacitance of the common floating diffusion (CFD) node may be denoted by the sum of capacitances of the floating diffusion regions FD1 to FD4. The common floating diffusion (CFD) node may receive photocharges from the photoelectric conversion elements PD1 to PD4 through the transfer transistors TA1 to TA4, and may temporarily store the received photocharges.

The transistor TB3 may be coupled to the common floating diffusion (CFD) node and the power-supply voltage (VDD), and may reset electric potential of the common floating diffusion (CFD) node in response to the reset signal RS. Thus, the transistor TB3 may operate as the reset transistor. For convenience of description, the transistor TB3 will hereinafter be referred to as the reset transistor.

The transistors TB4 and TB6 may be coupled to the power-supply voltage VDD and the transistors TC4 and TC6, and gate regions of the transistors TB4 and TB6 may be coupled to the common floating diffusion (CFD) node, such that a signal corresponding to an electric potential of the common floating diffusion (CFD) node may be generated and output to the transistors TC4 and TC6. Each of the transistors TB4 and TB6 may operate as a source follower transistor that amplifies a potential change of the common floating diffusion (CFD) node and outputs the amplified potential to the transistors TC4 and TC6. For convenience of description, each of the transistors TB4 and TB6 will hereinafter be referred to as a source follower transistor.

The transistors TC4 and TC6 may be coupled to the output node OUT and the source follower transistors TB4 and TB6. The transistors TC4 and TC6 may be turned on or off in response to a row selection signal RSS applied to gate electrodes thereof, such that the transistors TC4 and TC6 may transmit output signals of the source follower transistors TB4 and TB6 to the output node (OUT). The output node (OUT) may be coupled to the column line. Each of the transistors TC4 and TC6 may operate as the selection transistor. For convenience of description, each of the transistors TC4 and TC6 will hereinafter be referred to as the selection transistor.

The selection transistors TC4 and TC6 according to the present embodiment may be commonly coupled to the single output node (OUT), and may receive the same row selection signal (RSS) through gate regions thereof, such that the selection transistors TC4 and TC6 may operate as a single transistor having a relatively large channel width, resulting in implementation of a higher signal transfer rate of shared pixels.

Each of the transistors TC3 and TC5 may operate as a MOS capacitor in which a source region and a drain region are electrically coupled to each other. For convenience of description, each of the transistors TC3 and TC5 will hereinafter be referred to as a MOS capacitor. The MOS transistors TC3 and TC5 may be coupled to the power-supply voltage (VDD) and the transistor TB5. For example, in the MOS transistor TC3, a gate region of the MOS transistor TC3 may be coupled to the transistor TB5, and a source region and a drain region commonly coupled to each other may be coupled to the power-supply voltage (VDD). In the MOS transistor TC5, a gate region of the MOS transistor TC5 may be coupled to the power-supply voltage (VDD), and a source region and a drain region commonly coupled to each other may be coupled to the transistor TB5.

The transistor TB5 may be coupled to the common floating diffusion (CFD) node and the MOS transistors TC3 and TC5 coupled in parallel to each other. The transistor TB5 may be turned on or off in response to a gain control signal GCS, such that the transistor TB5 may adjust capacitance of the common floating diffusion (CFD) node. The gain control signal GCS may be received from the row decoder 120. For convenience of description, the transistor TB5 will hereinafter be referred to as the gain switching element.

For example, if the gain switching element TB5 is turned on by the gain control signal GCS, a capacitor of the common floating diffusion (CFD) node and the MOS capacitors TC3 and TC5 may be coupled in series between the power-supply voltage (VDD) and a ground voltage (ground), resulting in reduction of total capacitance.

As described above, the image sensing device according to the present embodiment may construct 4-shared pixels using 6 contiguous unit pixels PX1 to PX6, some transistors among transistors contained in the 4-shared pixels may be implemented as MOS capacitors, and the MOS capacitors may be selectively coupled to the floating diffusion node, such that a conversion gain of the image sensing device can be adjusted.

Figure 4:
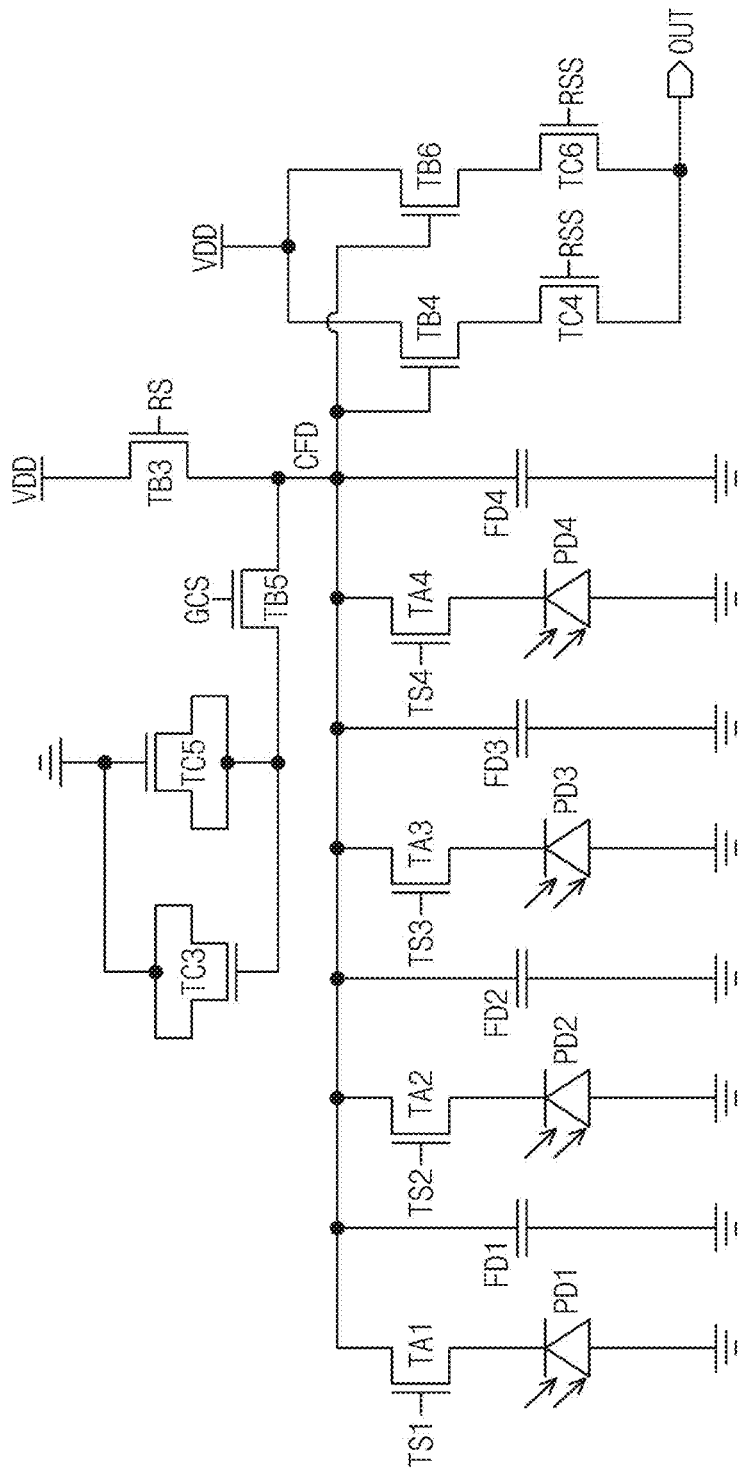
FIG. 4 is another example of an equivalent circuit diagram illustrating shared pixels shown in FIG. 2 based on some implementations of the disclosed technology.

FIG. 4 is another example of an equivalent circuit diagram illustrating shared pixels shown in FIG. 2 based on some implementations of the disclosed technology.

Referring to FIG. 4, the MOS capacitors TC3 and TC5 may be coupled to the ground voltage and the gain switching element TB5. For example, in the MOS transistor TC3, a gate region of the MOS transistor TC3 may be coupled to the gain switching element TB5, and a source region and a drain region commonly coupled to each other may be coupled to the ground voltage. In the MOS transistor TC5, a gate region of the MOS transistor TC5 may be coupled to the ground voltage, and a source region and a drain region commonly coupled to each other may be coupled to the gain switching element TB5.

If the gain switching element TB5 is turned on by the gain control signal GCS, a capacitor of the common floating diffusion (CFD) node and the MOS capacitors TC3 and TC5 may be coupled in parallel to each other, resulting in increased total capacitance. Thus, the conversion gain of the image sensing device can be adjusted based on the ON or OFF operation of the gain switching element TB5.

The remaining constituent elements other than the MOS capacitors TC3 and TC5 coupled to the ground voltage and the gain switching element TB5 in FIG. 4 may be identical to those of FIG. 3, and as such a detailed description thereof will hereinafter be omitted for convenience of description.

Figure 5:
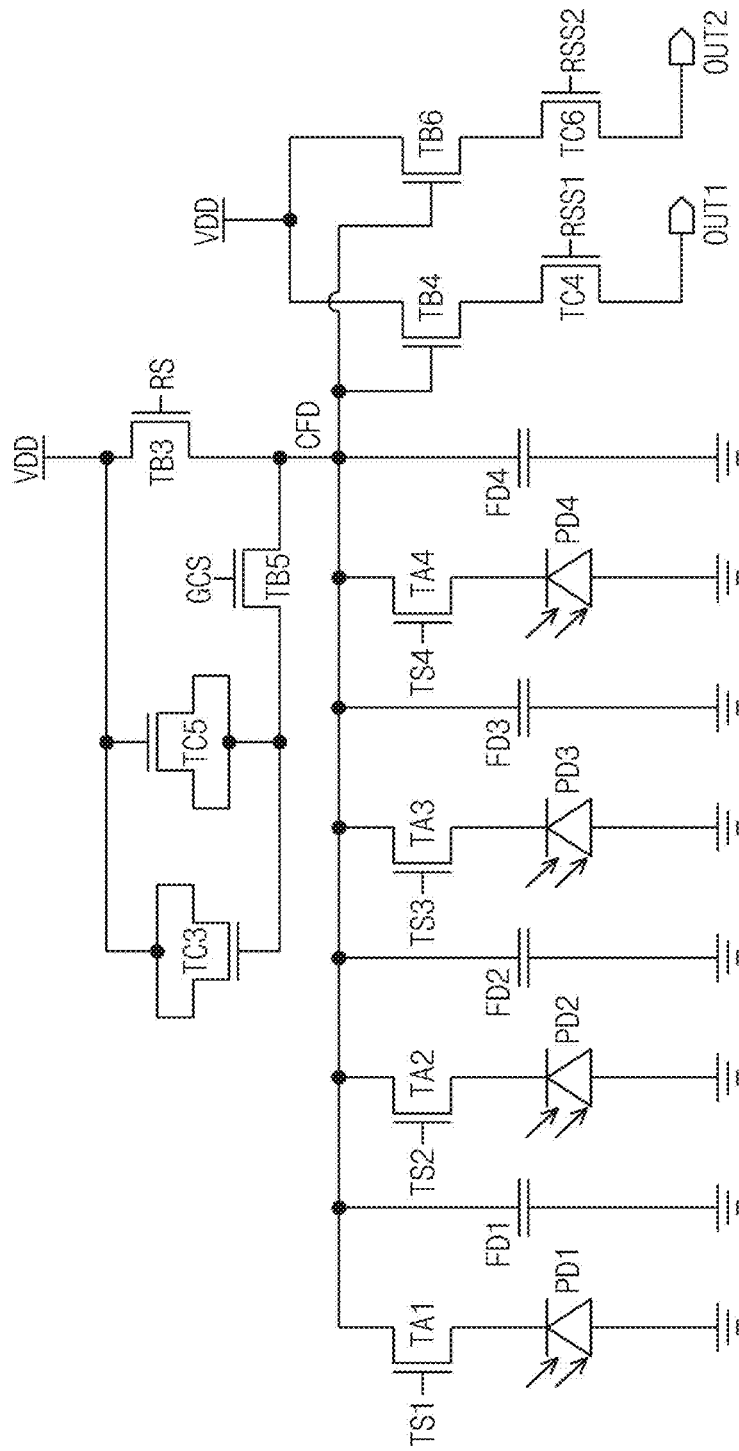
FIG. 5 is another example of an equivalent circuit diagram illustrating shared pixels shown in FIG. 2 based on some implementations of the disclosed technology.

FIG. 5 is another example of an equivalent circuit diagram illustrating shared pixels shown in FIG. 2 based on some implementations of the disclosed technology.

Referring to FIG. 5, the selection transistors TC4 and TC6 may be respectively coupled to different output nodes OUT1 and OUT2, and different row selection signals RSS1 and RSS2 may be respectively applied to gate regions of the selection transistors TC4 and TC6.

Whereas the selection transistors TC4 and TC6 shown in FIG. 3 are commonly coupled to the single output node (OUT) and are turned on or off in response to the same row selection signal RSS, the other selection transistors TC4 and TC6 shown in FIG. 5 may be coupled to different output nodes OUT1 and OUT2 and may be turned on or off in response to different row selection signals RSS1 and RSS2. By the above-mentioned structure, the selection transistors TC4 and TC6 may generate output signals independently from each other.

After a signal corresponding to a potential change of the common floating diffusion (CFD) node is output to the column line, the column line may be reset to receive the signal corresponding to the potential change of the common floating diffusion (CFD) node in a subsequent time section. In some implementations, a duration time needed to reset the column line may be relatively longer than time needed to create and transfer photocharges within the shared pixels. Therefore, the operation time of the shared pixels may unavoidably increase due to the duration time needed to reset the column line, such that the image sensing device may have difficulty in a high-speed operation.

However, as shown in FIG. 5, if the selection transistors TC4 and TC6 are independently controlled in a manner that output signals of the selection transistors TC4 and TC6 are alternately output through different output nodes OUT1 and OUT2, the shared pixels can operate at high speed irrespective of the reset time of the column line.

The remaining constituent elements other than the selection transistors TC4 and TC6 coupled to different output nodes OUT1 and OUT2 and gate regions coupled to different row selection signals RSS1 and RSS2 in FIG. 5 may be identical to those of FIG. 3, and thus, a detailed description thereof will hereinafter be omitted for convenience of description.

Figure 6:
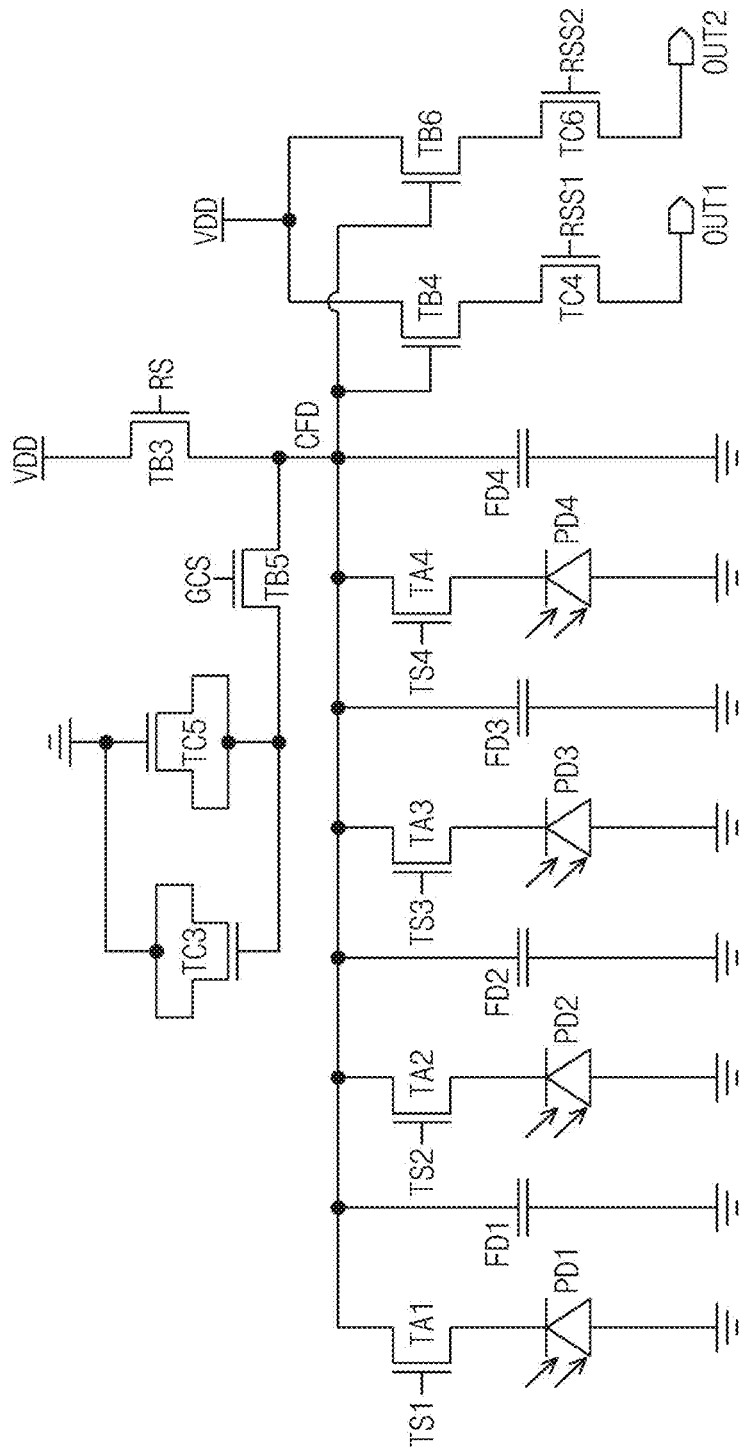
FIG. 6 is still another example of an equivalent circuit diagram illustrating shared pixels shown in FIG. 2 based on some implementations of the disclosed technology.

FIG. 6 is still another example of an equivalent circuit diagram illustrating shared pixels shown in FIG. 2 based on some implementations of the disclosed technology.

Referring to FIG. 6, the MOS capacitors TC3 and TC5 may be coupled to the ground voltage and the gain switching element TB5. The selection transistors TC4 and TC6 may be coupled to different output nodes OUT1 and OUT2, and different row selection signals RSS1 and RSS2 may be applied to gate regions of the selection transistors TC4 and TC6.

The MOS capacitors TC3 and TC5 according to the present embodiment may be selectively coupled in parallel to the capacitor of the common floating diffusion (CFD) node based on the turn-ON or turn-OFF operation of the gain switching element TB5 as shown in FIG. 4. In addition, output signals of the selection transistors TC4 and TC6 may be alternately output through different output nodes OUT1 and OUT2 as shown in FIG. 5.

As is apparent from the above description, the image sensing device according to the embodiments of the disclosed technology can adjust a conversion gain while simultaneously minimizing characteristic deviation between pixels, resulting in improvement of operational characteristics of the image sensing device.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An image sensing device comprising:
   a pixel group including first to sixth unit pixels, wherein the first unit pixel and the second unit pixel are arranged adjacent to each other in a first row, the third unit pixel and the fourth unit pixel are arranged adjacent to each other in a second row, and the fifth unit pixel and the sixth unit pixel are arranged adjacent to each other in a third row; and
   wherein each of the first to sixth unit pixels is disposed in a region isolated by a device isolation structure from adjacent unit pixels and includes a single photoelectric conversion element, a single floating diffusion region, and at least three transistors that are located in the region,
   wherein the floating diffusion regions of the first to fourth unit pixels are electrically connected to form a common floating diffusion node,
   wherein the at least three transistors of each of the third unit pixel and the fifth unit pixel include a first transistor configured as a metal oxide semiconductor (MOS) capacitor having a source region and a drain region that are electrically coupled to each other, and
   wherein the at least three transistors of each of the fourth unit pixel and the sixth unit pixel are not configured as MOS capacitors.

2. The image sensing device according to claim 1, wherein the at least three transistors include:
   a transfer transistor configured to transmit photocharges generated from the photoelectric conversion element to the floating diffusion region in response to a transmission signal.

3. The image sensing device according to claim 1, wherein the first transistors of the third unit pixel and the fifth unit pixel are coupled in parallel between a power-supply and a second transistor of the fifth unit pixel that is configured to be turned on or off in response to a gain control signal.

4. The image sensing device according to claim 1, wherein the first transistors of the third unit pixel and the fifth unit pixel are coupled in parallel between a ground voltage and a second transistor of the fifth unit pixel that is configured to be turned on or off in response to a gain control signal.

5. The image sensing device according to claim 1, wherein the at least three transistors of each of the fourth unit pixel and the sixth unit pixel include:
   a source follower transistor configured to output a signal corresponding to an electric potential of the common floating diffusion node; and
   a selection transistor configured to output a signal received from the source follower transistor to an output node in response to a row selection signal.

6. The image sensing device according to claim 5, wherein the selection transistor of the fourth unit pixel and the selection transistor of the sixth unit pixel are commonly coupled to the output node.

7. The image sensing device according to claim 5, wherein the selection transistor of the fourth unit pixel and the selection transistor of the sixth unit pixel are coupled to different output nodes.

8. The image sensing device according to claim 1, wherein the photoelectric conversion element, the floating diffusion region, and the at least three transistors are arranged symmetrical with respect to a boundary between any two of the first to six unit pixels that are arranged adjacent to each other in the first direction or in the second direction.

9. The image sensing device according to claim 1, wherein the at least three transistors of each of the first, third, and fifth unit pixels that are arranged in the second direction include the first transistor.

10. The image sensing device according to claim 1, wherein the at least three transistors of each of the third unit pixel and the fifth unit pixel are configured not to operate as a source follower transistor configured to output a signal corresponding to an electric potential of the common floating diffusion node and a selection transistor configured to output a signal received from the source follower transistor to an output node in response to a row selection signal.

11. An image sensing device comprising:
    a pixel group including first to sixth unit pixels such that the first unit pixel and the second unit pixel are arranged adjacent to each other in a first row, the third unit pixel and the fourth unit pixel are arranged adjacent to each other in a second row, and the fifth unit pixel and the sixth unit pixel are arranged adjacent to each other in a third row,
    wherein each of the first to sixth unit pixels includes a photoelectric conversion element and a floating diffusion region,
    floating diffusion regions of the first to fourth unit pixels are electrically interconnected to one another to form a common floating diffusion node, and
    some unit pixels among the third to sixth unit pixels include first transistors, each first transistor configured as a metal oxide semiconductor (MOS) capacitor having a source region and a drain region that are electrically coupled to each other, and any all transistors of remaining unit pixels other than the some unit pixels among the third to sixth unit pixels are not configured as MOS capacitors,
    wherein any one of the some unit pixels includes a second transistor configured to selectively connect the MOS capacitor to the common floating diffusion node.

12. The image sensing device according to claim 11, wherein MOS capacitors of the some unit pixels are coupled in parallel between a power-supply voltage and the second transistor.

13. The image sensing device according to claim 11, wherein MOS capacitors of the some unit pixels are coupled in parallel between a ground voltage and the second transistor.

14. The image sensing device according to claim 11, wherein the remaining unit pixels other than the some unit pixels among the third to sixth unit pixels include:
 a source follower transistor configured to output a signal corresponding to an electric potential of the common floating diffusion node; and
 a selection transistor configured to output a signal received from the source follower transistor to an output node in response to a row selection signal.

15. The image sensing device according to claim 14, wherein the selection transistors of the remaining unit pixels are commonly coupled to the output node.

16. The image sensing device according to claim 14, wherein the selection transistors of the remaining unit pixels are coupled to different output nodes.

17. The image sensing device according to claim 11, wherein any transistors of the some unit pixels are not configured as a source follower transistor configured to output a signal corresponding to an electric potential of the common floating diffusion node and a selection transistor configured to output a signal received from the source follower transistor to an output node in response to a row selection signal.

18. An image sensing device comprising:
 first to fourth unit pixels arranged adjacent to each other in a first direction and a second direction perpendicular to the first direction, each of which includes a photoelectric conversion element and a floating diffusion region,
 wherein the floating diffusion regions of the first to fourth unit pixels are electrically and commonly interconnected to form a common floating diffusion node, and
 some unit pixels among the first to fourth unit pixels include first transistors, each configured as a metal oxide semiconductor (MOS) capacitor having a source region and a drain region that are electrically coupled to each other, and any transistors of remaining unit pixels other than the some unit pixels among the first to fourth unit pixels are not configured as MOS capacitors;
 further comprising a fifth unit pixel including a second transistor configured as a MOS capacitor having a source region and a drain region that are electrically coupled to each other,
 wherein a first unit pixel and a third unit pixel of the unit pixels and the fifth unit pixel are sequentially arranged in a same column, and
 wherein the fifth unit pixel further includes a third transistor configured to selectively connect the MOS capacitors of the third unit pixel and the fifth unit pixel to the common floating diffusion node in response to a gain control signal.

* * * * *